United States Patent [19]

Shimbo et al.

[11] Patent Number: 4,949,342
[45] Date of Patent: Aug. 14, 1990

[54] CODE ERROR DETECTING METHOD

[75] Inventors: Masatoshi Shimbo, Minoo; Katsuhiro Kurosawa, Sagamihara, both of Japan

[73] Assignee: Matsushita Electric Industrial Co., Ltd., Osaka, Japan

[21] Appl. No.: 180,063

[22] Filed: Apr. 11, 1988

[30] Foreign Application Priority Data

Apr. 14, 1987 [JP] Japan .................................. 62-91341
Apr. 15, 1987 [JP] Japan .................................. 62-92526

[51] Int. Cl.⁵ .............................................. G06F 11/10
[52] U.S. Cl. .................................................. 371/40.1
[58] Field of Search ....................... 371/37, 38, 39, 40, 371/40.1; 360/38.1; 358/336

[56] References Cited

U.S. PATENT DOCUMENTS 4,564,945 1/1986 Glover et al. ........................... 371/38
4,633,471 12/1986 Perera et al. ............................ 371/38
4,675,869 6/1987 Driessen ................................. 371/37

OTHER PUBLICATIONS

Encoding Specification for the X3B11-Approved EDAC Code for 5¼ Inch Optical Storage Devices/Data Systems Technology, Corp. Neal Glover, Nov. 4, 1986.
Algebraic Coding Theory, Chapter 5, pp. 119–145, Elwyn R. Berkelamp, McGraw-Hill Book Company, 1968.
"Error-Correcting Codes", W. Wesley Peterson and E. J. Weldon, Jr., Second Edition, Chapter 8, pp. 206–268, 1972.

Primary Examiner—Charles E. Atkinson
Attorney, Agent, or Firm—Stevens, Davis, Miller & Mosher

[57] ABSTRACT

The code error detecting method uses the code error detecting apparatus which comprises a sector buffer memory for storing various kinds of data, an adder circuit for performing exclusive OR addition of data, a CRC generator/checker for producing error check parities by dividing a result of addition performed in the adder circuit by a predetermined generator polynomial, a temporary memory for storing the error check parities, and an error correction circuit for calculating error correction parities which are used to correct an error of the data. At the time of recording, the data incorporating various parities produced in the code error detecting apparatus is recorded on an optical disk, and, at the time of reproducing, the data reproduced and stored in the sector buffer memory is corrected by using the reproduced error correction parities, and the error check parities are obtained by using the CRC generator/checker. Then, the error check parities thus obtained are compared with the reproduced error check parities stored in the sector buffer memory to thereby detect a code error of the data.

7 Claims, 3 Drawing Sheets

FIG. 3

CODE ERROR DETECTING METHOD

BACKGROUND OF THE INVENTION

The present invention relates to a code error detecting method of correcting data in a data file apparatus employing an optical disk of a write once type or an erasable type.

DESCRIPTION OF THE PRIOR ART

Recently, an optical disk having a characteristic capable of recording a great amount of data with a high recording density in a non-contact fashion has attracted attention in the field of memories including an auxiliary storage of a computer. As an application of the optical disk, there have been data files of a write once type in which data can be only once additionally written and of an erasable type in which data can be rewritten as many times as necessary. Efforts have been made for the development of recording methods as well as servo methods in various manufacturers and institutes.

In a data file using an optical disk, the optical disk has a diameter of 5 ¼ (5.25) or 3.5 inches and tracks in a concentric or spiral form with a track pitch of about 1.6 micrometers ($\mu$m). A track is subdivided into a plurality of sectors constituting a circumference thereof such that a plurality of data items including symbols each comprising eight bits are written in the sector. For example, in a case of a 5.25 inch optical disk, there are disposed 18,750 tracks, a track includes 17 sectors, and the data capacity of each sector available for the user is 1024 bytes. In a data file having such an optical disk, the rotary speed of the disk is a constant angular speed of from about 1800 rpm to about 3600 rpm, and a semiconductor laser associated with a wavelength of about 830 nanometers (nm) is adopted as a light source. With a light beam of which a light spot is focused to at most about 1 $\mu$m, data are recorded on the tracks in the form of projected or depressed portions (of the write once type) or according to directions of magnetization perpendicular to a disk surface of the optical disk (of the erasable type). In an operation to record or to reproduce data on or from the optical disks as described above, if there exists any dust, fingerprint, or damage on the disk surface, data cannot be correctly written thereon or data previously correctly written thereon cannot be appropriately read out therefrom in some cases, which is in general referred to as a code error. To cope with this code error, there are added redundant data, namely, parity data other than the data utilized by the user so as to detect a code error for error correction so that the correct data can be read even if such a code error takes place. In the data reproduction, with the error correction processing employing the above error correction code, the inherent code error data of $10^{-4}$ to $10^{-5}$ of reproduced data on an optical disk can be reduced to at most $10^{-12}$ after the error correction processing is effected. According to this method, there is developed the same performance as that of the hard disk conventionally used. In the data file employing an optical disk of this kind, since the minimum unit of data treated by the user is a byte, the Reed-Solomon code is used in many cases in which the error correction can be achieved in byte unit and a lot of data can be corrected with reduced redundancy. Although the Reed-Solomon code enables error detection and correction to be efficiently accomplished, it has been known that mis-detection and mis-correction of an error occur with a certain probability. Consequently, in order to increase the reliability of reproduced data with respect to the error, in addition to the error correction codes described above, there are added several bytes of error detection codes only for all data in a sector which can be used by the user, for example, 1024 bytes. The several bytes are almost ignorable as a redundancy measure. With the duplicated error detection countermeasurements, for example, even when mis-detection and mis-correction of an error occur in a error correction processing of the first stage, the code error can be appropriately detected by a code error detection processing of the second stage, thereby retaining high reliability.

As an example of the data error correction and detection method for a data file employing the optical disk, the proposal under the title of "ENCODING SPECIFICATION FOR THE X3B11-APPROVED EDAC CODE FOR 5 ¼ INCH OPTICAL STORAGE DEVICES", Nov. 4, 1986 was submitted to the standardization committee for optical disk devices, ANSI X3B11.

According to this method, in a recording operation, a sector of user data including 1024 symbols and control data symbols are arranged in a memory area to configure a rectangular form with 10 vertical symbols $\times$ 104 horizontal symbols in which four symbols including the last data symbol in the 104-th row are assigned as the parity data for the error check of the user data. The error check parity data of this example is generated as follows. First, ten data symbols in each column among the data symbols in byte units arranged in the first column through the 103th column are subjected to exclusive OR addition. Further, in the 104-th column, exclusive OR addition of data of six symbols excepting the error check parity is performed, thereby generating, in total, 104 error check data in byte units. An error check information polynomial is constituted by the 104 data symbols in byte unit. The error check information polynomial is divided by a generator polynomial comprising four predetermined symbols of the Reed-Solomon code so as to use a residue or remainder resulting from the division as the error check parity and to assign the error check parity to the last four symbols in the 104-th column. This type of error detection method is known as the cyclic redundancy check code (CRC), and it is described in detail, for example, in Elwyn R. Berkelamp: "ALGEBRAIC CODING THEORY", Chapter 5, pages 119-145, McGraw-Hill Book Company and in W. Wesley Peterson and E. J. Weldon, Jr.: "ERROR-CORRECTING CODES", Second Edition, Chapter 8, pages 206-268.

In the prior art example, in a reproducing operation, the data are arranged, like in the case of the recording operation, in the form having 10 vertical symbols $\times$ 104 horizontal symbols. In the respective data symbols in byte unit arranged in the first column through the 103rd column, an exclusive OR addition of data of ten symbols in each column is performed. In the 104-th column, an exclusive OR addition of data of six symbols excepting the symbols for the error check parity is performed. Thus, an error check information polynomial for the total 104 data symbols in byte unit is obtained. The information polynomial is divided by the generator polynomial used in the recording operation so as to obtain a residue or remainder. The remainder is then compared with the error detection parity of the 104-th column added in the recording operation and corrected in the reproducing operation, thereby detecting the presence or absence of the error. In this method, for the generation of the information polynomial, an exclusive OR addition of data of ten or six symbols in each column is performed. Consequently, there arises a disadvantage that even when a plurality of errors occur in the respective columns, there may possibly be obtained a result identical to the result computed when there does not exist any error. For example, even when two data items having the same bit constitution are included in a column and the same error occurs on bits located at the same positions of the respective data items, it is natural that the same result of the exclusive OR addition of ten symbols is attained for this column in this case and in a case where there does not exist any error in the data item. However, in the error correction method of the data file utilizing the optical disk of this kind, there are provided error correction codes other than those adopted in the error detection method described above so as to correct an error of each data in advance, thereby greatly minimizing the chance of the operation in which the error described above is not appropriately detected. In the method of the prior art example, with respect to the error correction and the CRC error detection code, the generator polynomial differs, however, the Reed-Solomon code in byte unit of the same primitive polynomial is used, and hence various error detection methods can be considered by combining the error correction code with the CRC error detection code. In the proposal to ANSI X3B11 already described, however, the error detection method has not been presented. In general, the error detection is accomplished in the prior art example as follows. Namely, as described above, in the reproducing operation, firstly, the reproduced data and the error correction parity are arranged in the form having ten vertical symbols × 120 horizontal symbols like in the recording operation, by using 16 parity data items additionally disposed in advance for the error correction of the data associated with 104 user data symbols in a horizontal row, a maximum of eight errors are corrected for each row, and, for each data in byte unit in a range from the first column to the 103rd column, an exclusive OR addition of ten symbols in each column is effected and an exclusive OR addition six-symbol data of the 104-th column excepting the error detection parity so as to obtain an error check information polynomial for the total 104 data symbols in byte unit. The information polynomial is divided by the same generator polynomial used in the recording operation so as to compare the residue with the error correction parity in the 104-th column. If the residue is equal to the parity, it is judged that there does not exist any error. Otherwise, the existence of an error is determined. As the error detection method, there has been adopted a method in which all data items are written in the memory during the reproducing operation as shown in FIG. 1 and thereafter an error correction processing is performed on the data such that the same error detection processing is effected when the data thus corrected are transferred to the user side, for example, a host computer.

In this method, however, a result of the error detection is attained after all data items corrected are entirely transferred to the host computer, which causes a disadvantage in some cases.

SUMMARY OF THE INVENTION

It is therefore an object of the present invention to provide an error detection method of detecting a code error in a data file employing an optical disk in which, during a reproducing operation, an error location and an error pattern obtained in an error correction processing are used to correct the data constituting an information polynomial or a reception polynomial, thereby completing the error detection before the data are transferred to the user (host computer).

In order to achieve the above object, there is provided a method according to the present invention in which, in a recording operation, data including user data and control data representing addresses of an optical disk where the data are to be written is arranged in a form with n vertical symbols × m horizontal symbols, an exclusive OR addition is effected on n symbols in each vertical column ranging from the first column to the (m−1)-th column, and an exclusive OR addition is achieved on (n−t) symbols of the m-th column excepting t symbols including the last symbols, thereby establishing an information polynomial of data including the m symbols thus obtained. The information polynomial is then divided by a generator polynomial prepared beforehand for error detection and a residue obtained as a result of the division is arranged as an error detection parity in the t-byte location In a reproducing operation, if a code error is found in the data of the m symbols of a horizontal row selected from the data constituted with n vertical symbols × m horizontal symbols or in data of (m−1) symbols excepting the control data, an error correction is accomplished by using an error correction code separately determined and a correction is carried out on the error detecting information polynomial for the data subjected to the error correction based on a location and a pattern associated with the error data obtained in the error correction, thereby detecting an error according to the result of the correction.

In the above configuration, when the error correction is completed on the data in a sector, a code error detection on the corrected data is also completed almost at the same time, and hence the code error detection can be carried out before the data are transferred to the user (host computer) and all processing can be completely effected within a period of time associated with the sector.

BRIEF DESCRIPTION OF THE DRAWINGS

The present invention will be apparent from the following detailed description taken in conjunction with the accompanying drawings in which:

FIG. 3 is an explanatory diagram showing a data arrangement for performing code error detection in an embodiment of the present invention.

DESCRIPTION OF THE PREFERRED EMBODIMENT

Figure 1:
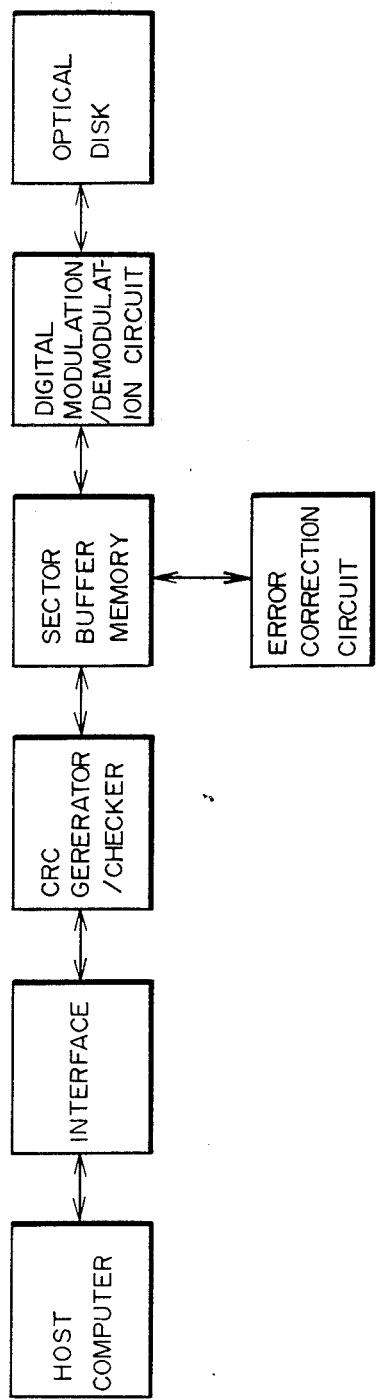
FIG. 1 is a block diagram showing a conventional system which performs code error detection on a data file using an optical disk.
Figure 2:
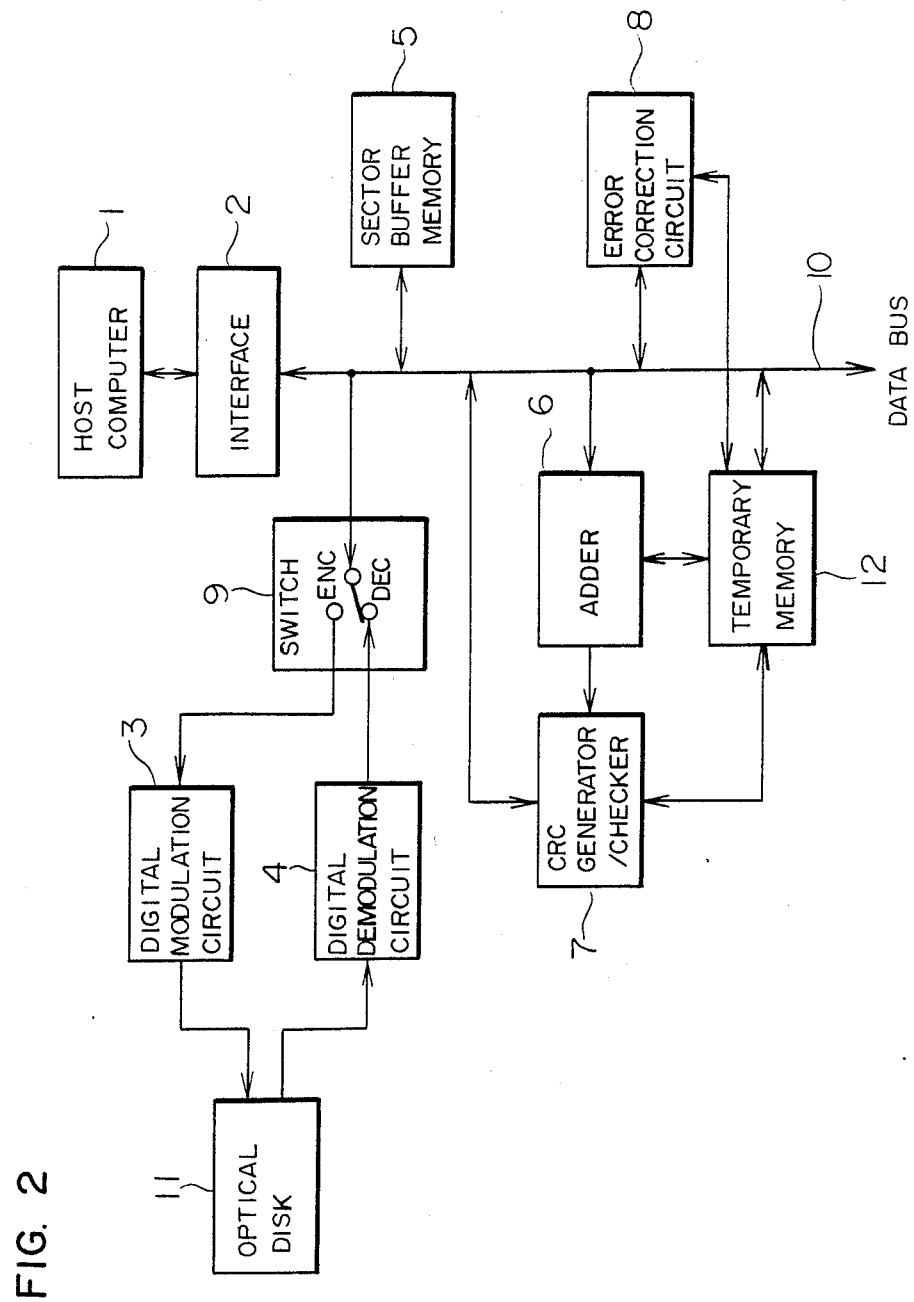
FIG. 2 is a block diagram showing a system of an embodiment of the present invention which performs code error detection on a data file using an optical disk.

The illustration of FIG. 2 includes a host computer 1, an interface 2, a digital modulation circuit 3, a digital demodulation circuit 4, a sector buffer memory 5, an adder 6 for performing an addition of exclusive OR results of ten symbol data or 6 symbol data used in making code error check, a code error detection code (CRC) generator/checker 7, an error correction circuit 8, an encode/decode change-over switch 9, a data bus 10, an optical disk 11, and a temporary memory 12.

Figure 3:
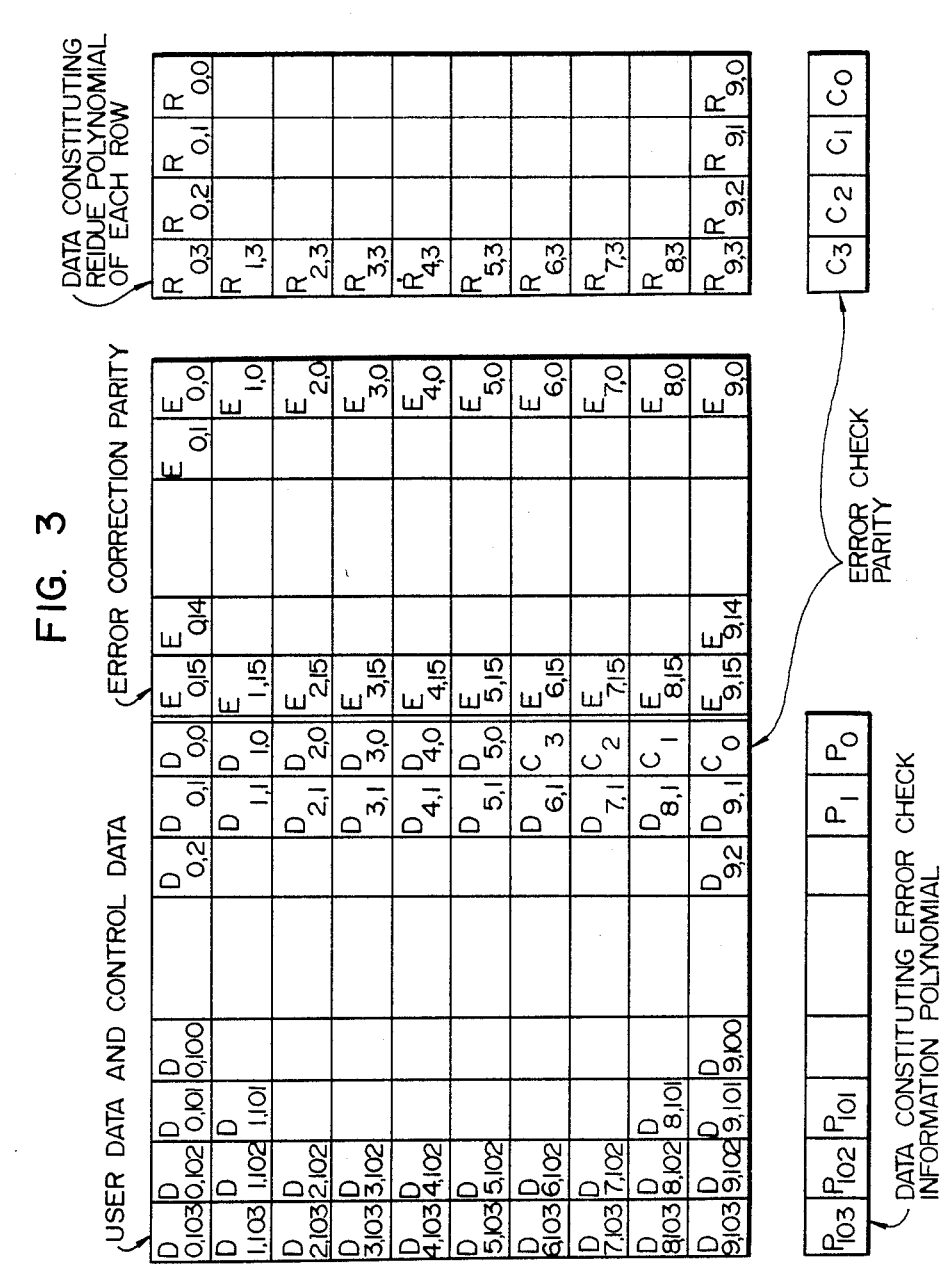

Furthermore, in the data arrangement of FIG. 3, $D_{i,j}$ ($0 \leq i \leq 9$, $0 \leq j \leq 103$) designates user data and control data, $E_{i,k}$ ($0 \leq k \leq 15$) denotes the error correction parity, $C_u$ ($0 \leq u \leq 3$) indicates the error check parity, $P_v$ ($0 \leq v \leq 103$) stands for data constituting an error check information polynomial, and $R_{i,s}$ ($0 \leq s \leq 3$) designates data constituting the residue polynomial of each row.

The denotation of symbols used in the respective cases are shown hereunder by taking the error correction parity symbol C as an example:

In the case of recording, "C" is used simply; in the case of reproducing, "C" is used; in the error correction, "C" is used; and when obtained by calculation, "C" is used.

First, in a recording operation, from the host computer 1, the user data and control data $D_{i,j}$ are supplied as symbols in byte unit via the interface 2 and the data bus 10 to the sector buffer memory 5 in the order of $D_{0,103}$, $D_{1,103}$, $D_{2,103}$, ..., $D_{9,103}$, $D_{0,102}$, ... $D_{9,102}$, ..., $D_{0,1}$, $D_{1,1}$, $D_{2,1}$, ..., $D_{9,1}$, $D_{0,0}$, $D_{1,0}$, $D_{2,0}$, $D_{3,0}$, $D_{4,0}$, and $D_{5,0}$ so as to be stored in the form with ten vertical symbols $\times$ 104 horizontal symbols as shown in FIG. 3. At the same time, the data items are supplied to the adder circuit 6, which in turn effects an addition of exclusive OR results as follows.

$$P_{103} = \sum_{i=0}^{9} D_{i,103}$$

$$P_{102} = \sum_{i=0}^{9} D_{i,102}$$

.
.
.

$$P_1 = \sum_{i=0}^{9} D_{i,1}$$

$$P_0 = \sum_{i=0}^{5} D_{i,0}$$

These data items represented by $P_v$ ($0 \leq v \leq 103$) are inputted to the CRC generator/checker 7 in the order of $P_{103}$, $P_{102}$, ..., $P_0$ so as to be divided by a predetermined four-symbol generator polynomial $G(x)$. A residue $R(x)$ resulting from the division is produced as error check parity data symbols $C_3$ to $C_0$, which are then written in the sector buffer memory 5. Subsequently, data items of a horizontal row including $D_{0,j}$, $D_{1,j}$, ..., $D_{5,j}$ ($0 \leq j \leq 103$); $D_{6,j}$ and $C_3$,$D_{7,j}$ and $C_2$, $D_{8,j}$ and $C_1$, $D_{9,j}$ and $C_0$ ($1 \leq j \leq 103$) are read out from the sector buffer so as to compute the error correction parity $E_{i,k}$ in the error correction circuit 8 and the parity $E_{i,k}$ is then written in the sector buffer memory 5. Finally, the data items of the sector buffer memory 5 are read out in the order of $D_{0,103}$, $D_{1,103}$, $D_{2,103}$, ..., $D_{9,103}$, $D_{0,102}$, $D_{1,102}$, $D_{2,102}$, ..., $D_{9,102}$, ..., $D_{0,1}$, $D_{1,1}$, $D_{2,1}$, ..., $D_{9,1}$, $D_{0,0}$, $D_{1,0}$, $D_{2,0}$, ..., $D_{5,0}$, $C_3$, $C_2$, $C_1$, $C_0$, $E_{0,15}$, $E_{1,12}$, $E_{2,15}$, ..., $E_{9,15}$, $E_{0,14}$, $E_{1,14}$, $E_{2,14}$, ..., $E_{9,14}$, ..., $E_{0,0}$, $E_{1,0}$, $E_{2,0}$, ..., $E_{9,0}$ so as to be supplied via the encode/decode switch 9 to the digital modulation circuit 3, which in turn adds signals such as a synchronization signal and records the resultant data items on the optical disk 11.

On the other hand, in a reproducing operation, data items read from the optical disk 11 are demodulated by the digital demodulation circuit 4 and are supplied via the encode/decode switch 9 to the sector buffer memory 5. The data items are written therein in the form with ten vertical symbols $\times$ 120 horizontal symbols, like in the recording operation, as shown in FIG. 3. At the same time, the data items are inputted to the adder 6, which then performs an addition of exclusive OR results as follows.

$$\hat{P}_{103} = \sum_{i=0}^{9} \hat{D}_{i,103}$$

$$\hat{P}_{102} = \sum_{i=0}^{9} \hat{D}_{i,102}$$

.
.
.

$$\hat{P}_0 = \sum_{i=0}^{5} \hat{D}_{i,0}$$

Where, $\wedge$ indicates that the data bearing this mark appear in a reproducing operation. These data $\hat{P}v$ ($0 \leq v \leq 103$) are written in a temporary memory 12. Next, the data $D_{0,j}$ ($0 \leq j \leq 103$) and $E_{0,k}$ ($0 \leq k \leq 15$) are sequentially read out in the direction from the left side to the right side in FIG. 3 and are supplied to the error correction circuit 8. In the error correction circuit 8, a location and a pattern of the error are computed. Then, data corresponding to the error location are read from the sector buffer memory 5 and are inputted to the error correction circuit 8. Thereafter, an exclusive OR addition is effected for the error pattern and the above data, and the resultant data are written again in the sector buffer memory 5 at the original address, thereby effecting the error correction. Subsequently, $\hat{P}v$ corresponding to the error location is read from the temporary memory 12 and is then supplied to the error correction circuit 8. An exclusive OR addition is effected for the error pattern and the above data, and the resultant data are written again in the temporary memory 12 at the original address. Then, the above operation is repeated for i ($1 \leq i \leq 9$) and thus it is repeated ten times in total. Finally, the data are read from the temporary memory 12 in the order of $\hat{P}_{103}$, $\hat{P}_{102}$, ..., $\hat{P}_1$, and $\hat{P}_0$ and are inputted to the CRC generator/checker 7, which conducts a division thereof by a predetermined generator polynomial $G(x)$ that has also been used in the recording operation. An explanation of the mark $\wedge$ soon follows. As a result, the residue $\hat{R}(x)$ is attained as $\hat{C}_3$ to $\hat{C}_0$, which are compared with the error correction parity $\hat{R}(x)$ subjected to the error correction, namely, $\hat{C}_3$ to $\hat{C}_0$ read from the sector buffer memory 5 and supplied to the CRC generator/checker 7. If a matching condition results, the system determines that there does not exist any error. Otherwise, the existence of an error is assumed. When the error is not found in this judgement, from the sector buffer memory 5, the user data $D_{i,j}$ are transferred via the data bus 10 and the interface 2 to the host computer 1. When the error is assumed, an error message is transmitted to the host computer 1. In the above description, the mark $\approx$ designates data that have been subjected to error correction in the reproducing operation, and the mark · indicates data obtained through a computation after the error correction. In this case, as the generator polynomial G(x) of the error check parity, the following is used when the primitive element of the finite field or Galois field obtained through a primitive polynomial $m(x)=x^8+x^4+x^3+x^2+1$ is assumed to be $\alpha$.

$$G(x) = \prod_{i=0}^{3} (x + \alpha^i)$$

Alternatively, as the generator polynomial G(x) of the error check parity, the following is used when the primitive element of the finite field or Galois field obtained through a primitive polynomial $m(x)=x^8+x^5+x^3+x^2+1$ is assumed to be $\alpha$.

$$G(x) = \prod_{i=136}^{139} (x + \alpha^{88i})$$

Here, the generator polynominal G(x) is in byte unit. However, the generator polynominal G(x) need not be necessarily associated with the byte unit, for example, there may also be employed $G(x)=x^{32}+x^{23}+x^{21}+x^{11}+x^2+1$ associated with the binary unit. In a case where the byte-unit generator polynominal is used, the error check parity Cu is here computed so as to satisfy the following expression.

$$R(x) = C_0, C_1, C_2, C_3$$
$$= \left[\left\{\left(\sum_{i=0}^{9} D_{i,103}\right) \cdot x^{103} + \left(\sum_{i=0}^{9} D_{i,102}\right) \cdot x^{102} \ldots + \left(\sum_{i=0}^{9} D_{i,1}\right) \cdot x + \left(\sum_{i=0}^{5} D_{i,0}\right)\right\} \cdot x^4\right] \mod \prod_{i=0}^{3}(x + \alpha^i)$$

or $$R(x) = C_0, C_1, C_2, C_3$$
$$= \left[\left\{\left(\sum_{i=0}^{9} D_{i,103}\right) \cdot x^{103} + \left(\sum_{i=0}^{9} D_{i,102}\right) \cdot x^{102} \ldots + \left(\sum_{i=0}^{9} D_{i,1}\right) \cdot x + \left(\sum_{i=0}^{5} D_{i,0}\right)\right\} \cdot x^4\right] \mod \prod_{i=136}^{139}(x + \alpha^{88i})$$

When using a binary-unit generation polynomial the residue is obtained in the same way as the conventional method on assumption that the 8 bit data including $$\left(\sum_{i=0}^{9} D_{i,103}\right), \left(\sum_{i=0}^{9} D_{i,102}\right), \ldots, \text{and}$$

are continuous bit streams, respectively, and then the result need only be divided into 8 bit units.

In addition, in place of the operation as described above in which the error check parity $\overset{\approx}{R}(x)$, namely, $\overset{\approx}{C}_3$ to $\overset{\approx}{C}_0$ that are computed and are added in the recording operation and that are subjected to the error correction processing are compared with $\overset{\cdot}{R}(x)$, namely, $\overset{\cdot}{C}_3$ to $\overset{\cdot}{C}_0$ attained through a computation in the reproducing operation so as to judge the presence or absence of the error, it is possible to supply the CRC generator/-checker 7 with $\overset{\cdot}{P}u$ from the temporary memory 12 and $\overset{\approx}{R}(x)$ from the sector buffer memory 5 in the sequence of $\overset{\cdot}{P}_{103}, \overset{\cdot}{P}_{102}, \ldots, \overset{\cdot}{P}_0, \overset{\approx}{C}_3, \overset{\approx}{C}_2, \overset{\approx}{C}_1,$ and $\overset{\approx}{C}_0$ so as to be divided by the generator polynomial G(x), thereby determining the presence or absence of an error from the fact that the residue is not 0 or 0, respectively.

Next, a second embodiment of this invention will be explained.

In the first embodiment, the data items constituting the error check information polynomial are beforehand generated through an addition of exclusive OR results of the ten byte or 6 byte reproduction data in the column direction of FIG. 3 and thereafter by using the error location and the error pattern obtained during the error correction associated with each row, a correction is also effected on the data items constituting the information polynomial so as to accomplish the error detection. In contrast with the first embodiment, according to the second embodiment, an error correction is first performed on data in an N-th row of FIG. 3, and an addition of exclusive OR results of the data of the N-th row thus corrected and the data of the (N+1)-th row not corrected is conducted for each symbol located in the same column so as to generate data items constituting a provisional information polynomial. Subsequently, error corrections are repeatedly performed on the data of the (N+1)-th row and the data items associated with the provisional information polynomial so as to effect a correction of the information polynomial, thereby carrying out the error detection. In this situation, the operation to record the data is the same as that of the first embodiment. In the recording operation, data read from the optical disk 11 are demodulated by the digital demodulation circuit 4 and are then written via the encode/decode change-over switch 9 in the sector buffer memory 5 in the data arrangement, like in the recording operation, constituted by ten vertical symbols $\times$ 120 horizontal symbols as shown in FIG. 3. Next, the data and the error correction parity including $\hat{D}_{0,103}, \hat{D}_{0,102}, \ldots, \hat{D}_{0,0}, \hat{E}_{0,15}, \ldots,$ and $\hat{E}_{0,0}$ of the upper-most row of FIG. 3 are read from the sector buffer memory 5 and are then supplied to the error correction circuit 8. At the same time, data items $\hat{D}_{0,103}, \hat{D}_{0,102}, \ldots,$ and $\hat{D}_{0,0}$ are written in the temporary memory 12. In the error correction circuit 8, the location and the pattern of the error are computed for the error correction. Thereafter, the error data corresponding to the error location are read from the temporary memory 12 and are delivered to the error correction circuit 8 which then effects an exclusive OR addition of the error pattern and the data thus read out, thereby performing the error correction. The resultant data are written again in the temporary memory 12 at the original address. In this operation, in the error correction circuit 8, the data $\check{D}_{0,103}$ is inputted to an input terminal of a syndrome generator and to an input terminal of an exclusive OR circuit. At the same time, the corrected data $\check{D}_{0,103}$ is read from the temporary memory 12 and is supplied to the other input terminal of the exclusive OR circuit of the error correction circuit 8, and then a computation of $\hat{P}_{103}=\check{D}_{0,102} \oplus \check{D}_{0,103}$ is accomplished, and the obtained data are written again in the temporary memory 12 at the original address. Subsequently, in a similar way, while $\check{D}_{0,102}, \check{D}_{0,101}, \ldots,$ and $\check{D}_{0,0}$ are sequentially supplied to the syndrome generator and the exclusive OR circuit, computations of $\hat{P}_{102}=\check{D}_{0,102} \oplus \check{D}_{0,102}, \hat{P}_{101}=\check{D}_{0,101}, \oplus \check{D}_{0,101}, \ldots,$ and $\hat{P}_0 = \hat{D}_{0,0} + \mathring{D}_{0,0}$ are effected and the resultant data items are written again in the temporary memory 12 at the respective original addresses. After these operations are completed, the error location and the error pattern are computed for the data and the error check parity in the second row of FIG. 3. Data corresponding to the error location are read from the sector buffer memory 5 and are then delivered to the error correction circuit 8, which turn effects an exclusive OR addition of the error pattern and the data thus read out, thereby achieving the error correction. The resultant data are written again in the sector buffer memory 5 at the original address. Subsequently, $\hat{P}u$ corresponding to the error location are read from the temporary memory 12 and are fed to the error correction circuit 8, which in turn effects an exclusive OR addition of the error pattern and the data of $\hat{P}u$ thus read out, thereby performing the error correction. The resultant data are written again in the temporary memory 12 at the original address. Following this operation, for the data from the third row to the tenth row, the similar processing is repetitiously carried out. When the error correction and the correction of data items constituting the information polynomial for the CRC computation are completed for the data of tenth row, there are obtained in the temporary memory 12 the data items constituting the information polynomial for the CRC computation which data items are identical to those of the first embodiment.

Next, a third embodiment of the present invention will be explained.

In the third embodiment different from the first and second embodiments, in a reproducing operation, the data read from the optical disk 11 are written in the sector buffer memory 5, like in the recording operation, to form a shape constituted by ten vertical symbols ×120 horizontal symbols. Next, the data and the error correction parity of the first horizontal row of the upper-most line of FIG. 3 including $\hat{D}_{0,103}, \hat{D}_{0,102}, \ldots, \hat{D}_{0,0}, \hat{E}_{0,15}, \ldots,$ and $\hat{E}_{0,0}$ are read from the sector buffer memory 5 and are then inputted to the error correction circuit 8, which in turn effects an error correction for the received data and parity. The corrected data are thereafter written again in the sector buffer memory 5 at the original address. Subsequently, the corrected data $\mathring{D}_{0,103}, \mathring{D}_{0,102}, \ldots,$ and $\mathring{D}_{0,0}$ are read from the sector buffer memory 5 so as to be supplied to the CRC generator/checker 7, which divides the data by a predetermined generator polynomial $G(x)$ to obtain a residue $\mathring{R}_0(x)$, namely, $\mathring{C}_{0,3}, \mathring{C}_{0,2}, \mathring{C}_{0,1},$ and $\mathring{C}_{0,0}$ to be stored in the temporary memory 12. Similarly, for the rows ranging from the second row to the sixth row, there is obtained a residue for each column, namely, $\mathring{R}_1(x)$ to $\mathring{R}_5(x)$ including $\mathring{C}_{1,3}, \mathring{C}_{1,2}, \mathring{C}_{1,1}, \mathring{C}_{1,0}, \ldots, \mathring{C}_{5,3}, \mathring{C}_{5,2}, \mathring{C}_{5,1}, \mathring{C}_{5,0}$, which are then written in the temporary memory 12.

In the almost similar fashion, the residue is obtained for each of the rows ranging from the seventh row to the tenth row, which is different from that of each of the rows ranging from the first row to the sixth row. Namely, as can be seen from FIG. 3, the number of data items of each row is smaller than that of each row associated with the rows ranging from the first row to the sixth row by one symbol and hence the computation is carried out on assumption that $\emptyset$ data exists in that location. In this fashion, there are obtained the residues $\mathring{R}_6(x) - \mathring{R}_9(x)$, namely, $\mathring{C}_{6,3}, \mathring{C}_{6,2}, \mathring{C}_{6,1}, \mathring{C}_{6,0}$ to $\mathring{C}_{9,3}, \mathring{C}_{9,2}, \mathring{C}_{9,1}, \mathring{C}_{9,0}$. Finally, an addition of the exclusive OR results is effected on $\mathring{R}_0(x)$ to $\mathring{R}_9(x)$ as follows.

$$R(x) = R_1(x) \oplus R_2(x) \oplus \ldots \oplus R_9(x) = \sum_{i=0}^{9} R_i(x)$$

$$C_3 = C_{0,3} \oplus C_{1,3} \oplus \ldots \oplus C_{9,3}$$

$$C_2 = C_{0,2} \oplus C_{1,2} \oplus \ldots \oplus C_{9,2}$$

$$C_1 = C_{0,1} \oplus C_{1,1} \oplus \ldots \oplus C_{9,1}$$

$$C_0 = C_{0,0} \oplus C_{1,0} \oplus \ldots \oplus C_{9,0}$$

The error detection after this point is identical to that described in conjunction with the second embodiment.

It is necessary here to prove that the residues of the first and embodiment are equal to those of the third embodiment. For simplification of the description, it is assumed that there does not exist any error in a reproducing operation. Naturally, the essential properties are not lost by the above assumption.

In the embodiment of FIG. 3, the following expressions are obtained by assuming that the information polynominal and the generator polynominal of the first row of FIG. 3 are $Mi(x)$ and $G(x)$, respectively, and that the quotient polynominal and the residue polynominal obtained by dividing the information polynominal $Mi(x)$ by the generator polynominal $G(x)$ are $Qi(x)$ and $Ri(x)$, respectively.

$$R_0(x) = x^4 \cdot M_0(x) + Q_0(x) G(x)$$
$$R_1(x) = x^4 \cdot M_1(x) + Q_1(x) G(x)$$
$$\vdots$$
$$R_9(x) = x^4 \cdot M_9(x) + Q_9(x) G(x)$$

Assume here that an addition of the data $R_0(x)$ to $R_9(x)$ is represented by $Rc(x)$, namely, $$R_c(x) = \sum_{i=0}^{9} R_i(x) = x^4 \cdot \sum_{i=0}^{9} M_i(x) + G(x) \cdot \sum_{i=0}^{9} Q_i(x)$$

where, $$M_0(x) = D_{0,103} \cdot x^{103} + D_{0,102} \cdot x^{102} + \ldots + D_{0,1} \cdot x + D_{0,0}$$
$$M_1(x) = D_{1,103} \cdot x^{103} + D_{0,102} \cdot x^{102} + \ldots + D_{1,1} \cdot x + D_{1,0}$$
$$\vdots$$
$$M_5(x) = D_{5,103} \cdot x^{103} + D_{5,102} \cdot x^{102} + \ldots + D_{5,1} \cdot x + D_{5,0}$$
$$M_0(x) = D_{6,103} \cdot x^{103} + D_{6,102} \cdot x^{102} + \ldots + D_{6,1} \cdot x$$
$$\vdots$$
$$M_9(x) = D_{9,103} \cdot x^{103} + D_{9,102} \cdot x^{102} + \ldots + D_{9,1} \cdot x$$

Here, the following relationship is satisfied in the first embodiment.

$$M(x) = (D_{0,103} \oplus D_{1,103} \oplus \ldots \oplus D_{9,103}) \cdot x^{103} +$$
$$(D_{0,102} \oplus D_{1,102} \oplus \ldots \oplus D_{9,102}) \cdot x^{102} +$$
$$\ldots +$$
$$(D_{0,1} \oplus D_{1,1} \oplus \ldots \oplus D_{9,1}) \cdot x +$$
$$(D_{0,0} \oplus D_{1,0} \oplus \ldots \oplus D_{5,0})$$
$$= \sum_{i=0}^{9} M_i(x)$$

Consequently, the error check parity, namely, the residue polynominal of the first embodiment is expressed as follows.

$$R_D(x) = x^4 \cdot M(x) + Q_D(x) G(x)$$

Let us check whether or not $R_C(x) = R_D(x)$ is satisfied.

$$R_C(x) - R_D(x) = x^4 \cdot \sum_{i=0}^{9} M_i(x) + G(x) \cdot \sum_{i=0}^{9} Q_i(x) -$$
$$x^4 \cdot M(x) - Q_D(x) G(x)$$
$$= \left( \sum_{i=0}^{9} Q_i(x) - Q_D(x) \right) G(x)$$

Assuming here that $G(x)$ is a polynominal of t degree, the expression on the left side is a polynominal of $t-1$ degree at most. On the other hand, if $$\left( \sum_{i=0}^{9} Q_i(x) - Q_D(x) \right) \neq 0,$$

the expression on the right side becomes a polynomial of degree t or more, which is inconsistent with the $t-1$ degree on the left side. Consequently, $$\left( \sum_{i=0}^{9} Q_i(x) - Q_D(x) \right) = 0$$

must be satisfied. As a result, $R_C(x) = R_D(x)$ is attained. That is, the error check parity of the first embodiment is identical to that of the third embodiment.

According to the third embodiment, after the error correction is performed on the data of each horizontal row of FIG. 3 so as to obtain the error check parity of each horizontal row, an addition of exclusive OR results is effected for the error check parity obtained for each horizontal row so that the result of the addition is compared with the error check parity obtained in the recording operation, thereby detecting the presence or absence of the error. Consequently, a relatively long period of time is required to accomplish the computation. Next, an embodiment for improving the above operation will be described.

In this embodiment, the data of a horizontal row of FIG. 3 are transferred from the sector buffer memory 5 to the error correction circuit 8, and then after the error correction is completed, the corrected data are written again in the sector buffer memory 5 at the original address Subsequently, the data of the second row are transferred from the sector buffer memory 5 to the error correction circuit 8, and then after the error correction is completed, the corrected data are written again in the sector buffer memory 5 at the original address. According to the error correction procedure in this embodiment, a syndrome is computed by using the data first transferred from the sector buffer memory 5. Next, based on the syndrome thus obtained, the error location polynomial and error evaluator polynomial are computed so as to obtain the error location and the error pattern therefrom. Error data corresponding to the error location are read from the sector buffer memory 5 and then an addition of exclusive OR results is effected between the error data and the error pattern so as to perform the error correction, thereby writing again the corrected data in the sector buffer memory 5 at the original address. In this operation, the sector buffer memory 5 is accessed only when the data of a horizontal row are transferred to the error correction circuit 8 to obtain the syndrome, when the error data are read out, and when the corrected data are rewritten. Namely, since the sector buffer memory 5 is not accessed when the error correction circuit 8 is computing the error location and the error pattern, this period of time is allocated to an operation to read from the sector buffer memory 5 the corrected data of the first row of FIG. 3 including $\dot{D}_{0,103}, \dot{D}_{0,102}, \ldots$, and $\dot{D}_{0,0}$, which are then inputted to the CRC generator/checker 7. In the CRC generator/checker 7, the data items are subdivided by the generator polynomial $G(x)$ and the residue $\dot{R}_0(x)$ is obtained as $\dot{C}_{0,3}, \dot{C}_{0,2}, \dot{C}_{0,1}$, and $\dot{C}_{0,0}$ so as to be written in the temporary memory 12. In the similar fashion, the error correction up to the tenth row is effected and $\dot{C}_{1,3}, \dot{C}_{1,2}, \dot{C}_{1,0}, \ldots, \dot{C}_{8,3p}, \dot{C}_{8,2}, \dot{C}_{8,1}$ and $\dot{C}_{8,0}$ as the residues $\dot{R}_1(x)$ to $\dot{R}_8(x)$ up to the ninth row are obtained, and they are written in the temporary memory 12.

Finally, the corrected data items $\dot{D}_{9,103}, \dot{D}_{9,102}, \ldots, \dot{D}_{9,0}$ of the tenth row are read from the secton buffer memory 5 so as to be supplied to the CRC generator/checker 7. In the CRC generator/checker 7, the residue $\dot{R}_9(x)$ is obtained as $\dot{C}_{9,3}, \dot{C}_{9,2}, \dot{C}_{9,1}$, and $\dot{C}_{9,0}$. Next, the residues $\dot{R}_0(x)$ to $\dot{R}_9(x)$ are read from the temporary memory and are then inputted to the error correction circuit 8, which performs an addition of exclusive OR results of the residues $\dot{R}_0(x)$ to $\dot{R}_9(x)$ to thereby obtain the final error check parity data $\dot{C}_3, \dot{C}_2, \dot{C}_1$, and $\dot{C}_0$. These error check parity data are compared with the error check parity data $\dot{C}_3, \dot{C}_2, \dot{C}_1$, and $\dot{C}_0$ which have been added to the 104-th column shown in FIG. 3 in the recording operation and for which error correction has been effected in the reproducing operation, thereby accomplishing the error detection. In an error correction code system, like that discussed in the present invention, which deals with an error correction code whose minimum inter-code distance is as great as 17, the processing to compute the error location and the error pattern requires relatively a long period of time. That is, the period of time associated with the processing above is sufficient for the system to read the data of a horizontal row from the sector buffer memory 5 and to transfer the data to the CRC generator/checker 7 so as to effect the processing. Furthermore, this method is of course applicable to the error check parity generation in the recording operation, if it is assumed that any error does not exist exactly in the reproducing operation.

Now, as already described with respect to the prior art example, in the method of producing an information polynomial by performing an addition of exclusive OR results of ten vertical symbols in each column among the data arranged in the form having ten vertical symbols and 104 horizontal symbols, if an even number of errors should occur at the same bit positions of the data having the same bit structure in a column, an addition of exclusive OR results of the ten vertical symbols in the column becomes completely identical to that obtained when there exists no error. Similarly, in an error detection method in which error correction is performed for each horizontal row so as to obtain an information polynomial by using data resulting therefrom, the information polynomial thus obtained is then divided by a generator polynomial to obtain a residue polynomial for each row, and finally the residue polynomials for respective rows are added together to effect error detection, for example, if all data in two rows are identical with each other and identical errors should occur at the same positions thereof, the two resultant residue polynomials become completely identical with each other, namely, an exclusive OR addition therefrom becomes identical to that obtained when there does not exist any error. In these cases, it results that the existence of such errors is overlooked. Although it is considered that such cases stand generally with low probability, if two separate code error detection methods are used in parallel to decide the existence of an error and if the existence of an error is detected by any one of the two methods, it is possible to assure high reliability.

While the present invention has been described with reference to the particular embodiments, it is not restricted by those embodiments but only by the appended claims. It is to be appreciated that those skilled in the art can change and modify the embodiments without departing from the scope and spirit of the present invention.

We claim:

1. A code error detecting method for detecting a code error of data which is recorded on or reproduced from an optical disk by using a code error detecting apparatus, which code error detecting apparatus comprises:

a sector buffer memory for arranging an storing data in a table of n×m symbols, said data including user's data and control data indicating data recording addresses on an optical disk;

an adder circuit for performing exclusive OR addition of data of n symbols in each vertical column of said table from a first vertical column through an (m−1)-th vertical column and for performing exclusive OR addition of (n−t) symbols in an m-th vertical column;

a CRC generator/checker for dividing information polynominal data constituted by data of m symbols obtained from a result of addition performed on the first vertical column through the m-th vertical column of said table in said adder circuit by a predetermined generator polynominal for error checking;

a temporary memory for storing said polynominal data and error check parities of t symbols obtained as residuals resulting from the division performed by said CRC generator/checker; and an error correction circuit for calculating error correction parities for data of m symbols in each horizontal row from a first horizontal row through an n-th horizontal row of said table;

said method comprising the steps of: in a recording operation, in parallel with storing data in said sector buffer memory, performing in said adder circuit exclusive OR addition of data of n symbols in each vertical column from the first vertical column through the (m−1)-th vertical column of said table and performing exclusive OR addition of (n−t) symbols in the m-th vertical column;

inputting the data of m symbols of said table to said CRC generator/checker and obtaining error check parities of t symbols as first residuals resulting from a division in said CRC generator/checker of the data of m symbols by a predetermined generator polynominal for error checking;

storing the error check parities in t addresses including the last data of the m-th vertical column of said table of said sector buffer memory;

reading out data of m symbols in each horizontal row from the first horizontal row through the n-th horizontal row of said table of said sector buffer memory, inputting the read-out data of m symbols to said error correction circuit, and dividing the inputted data of m symbols by a predetermined generator polynominal for error correction in said error correction circuit to thereby obtain error correction parities for each horizontal row;

storing the error correction parities thus obtained in an (m+1)-th and subsequent columns of said table of said sector buffer memory; and reading out the data sequentially starting from the first vertical column of said sector buffer memory to record the data on said optical disk, and in a reproduction operation, storing data reproduced from said optical disk in said sector buffer memory in the same order at that at the time of recording;

reading out the data in each horizontal row from the first horizontal row through the n-th horizontal row of said table of said sector buffer memory and inputting the read-out data to said error correction circuit to obtain a location and a pattern of an error therein;

reading out data corresponding to the location of the error from said sector buffer memory and inputting the read-out data to said error correction circuit;

correcting the error by performing exclusive OR addition of the inputted data and the pattern of the error in said error correction circuit, and storing the corrected data at the original address of corresponding uncorrected data from said table of said sector buffer memory;

reading out from said sector buffer memory the data in each horizontal row from a first horizontal row through an (n−t)-th horizontal row excluding the error correction parities in said table of said sector buffer memory and inputting the read-out data to said CRD generator/checker;

dividing the inputted data by the same generator polynominal as that used at the time of recording in said CRC generator checker to obtain second residuals and storing the second residuals in said temporary memory;

reading out the data in each horizontal row from an (n−t+1)-th horizontal row to the n-th horizontal row excludinq the error correction parities and the error check parities in said table of said sector buffer memory and inputting the read-out data to said CRC generator/checker and adding data "0" to the inputted data from the (n−t+1)-th horizontal row to the n-th horizontal row and dividing the data by the same generator polynominal as that used at the time of recording to obtain third residuals and storing the third residuals in said temporary memory; arranging the second and the third residuals in n×t symbols as a whole;

reading out the data in each vertical column from a first vertical column to a t-th vertical column of said temporary memory and inputting the read-out data to said adder circuit;

performing exclusive OR addition of n symbols in said adder circuit and inputting resultant data of the exclusive OR addition to said CRC generator/checker;

reading out the error check parities from said sector buffer memory and inputting the read-out error check parities to said CRC generator/checker; and comparing respective corresponding parities with each other and deciding that no error exists when all the comparisons indicate coincidence, but that an error exists when any one or more of the comparisons indicates non-coincidence, thereby effecting error correction of data in each sector and simultaneously effecting detection of a code error of the data in the course of reproducing data from the optical disk.

2. A code error detecting method for detecting a code error of data which is recorded on or reproduced from an optical disk by using a code error detecting apparatus, which code error detecting apparatus comprises:

a sector buffer memory for arranging and storing data in a table of n×m symbols, said data including user's data and control data indicating data recording addresses on an optical disk;

an adder circuit for performing exclusive OR addition of data of n symbols in each vertical column of said table from a first vertical column through an (m−1)-th vertical column and for performing exclusive OR addition of (n−t) symbols in an m-th vertical column;

a CRC generator/checker for dividing information polynominal data constituted by data of m symbols obtained from a result of addition performed on the first vertical column through the m-th vertical column of said table in said adder circuit by a predetermined generator polynominal for error checking;

a temporary memory for storing said polynominal data and error check parities of t symbols which are residuals obtained as a result of the division performed by said CRC generator/checker; and an error correction circuit for calculating error correction parities for data of m symbols in each horizontal row from a first horizontal row through an n-th horizontal row of said table, said method comprising the steps of: in a recording operation, in parallel with storing data in said sector buffer memory, performing in said adder circuit exclusive OR addition of data of n symbols in each vertical column from the first vertical column through the (m−1)-th vertical column of said table and performing exclusive OR addition of (n−t) symbols in the m-th vertical column;

inputting the data of m symbols to said table to said CRC generator/checker and obtaining error check parities of t symbols as first residuals resulting from a division in said CRC generator/checker of the data of m symbols by a predetermined generator polynominal for error checking;

storing the error check parities in t addresses including the last data of the m-th vertical column of said table of said sector buffer memory;

reading out data of m symbols in each horizontal row from the first horizontal row through the n-th horizontal row of said table of said sector buffer memory, inputting the read-out data of m symbols to said error correction circuit, and dividing the inputted data of m symbols by a predetermined generator polynominal for error correction in said error correction circuit to thereby obtain error correction parities for each horizontal row, storing the error correction parities thus obtained in an (m+1)-th and subsequent columns of said table of said sector buffer memory; and reading out the data sequentially starting from the first vertical column of said sector buffer memory to record the data on said optical disk, and in a reproduction operation, storing data reproduced from said optical disk in said sector buffer memory in the same order as that at the time of recording;

in parallel with the storing of the reproduced data in said sector buffer memory, performing in said adder circuit exclusive OR addition of data of n symbols in each vertical column from a first vertical column through the (m−1)-th vertical column of said table of said sector buffer memory, performing exclusive OR addition of data of (n−t) symbols stored in the m-th vertical column, and storing results of the additions in said temporary memory;

reading out data including the error correction parities in each horizontal row from the first horizontal row through the n-th horizontal row of said table of said sector buffer memory and inputting the read-out data to said error correction circuit to obtain a location and a pattern of an error therein;

reading out data corresponding to the location of the error from said sector buffer memory and inputting the read-out data to said error correction circuit;

correcting the error by performing exclusive OR addition of the inputted data and the pattern of the error in said error correction circuit, and storing the corrected data at the original address of corresponding uncorrected data from said table of said sector buffer memory;

reading out data corresponding to the location of the error from said temporary memory and inputting the read-out data to said error correction circuit, correcting the error in said error correction circuit by performing exclusive OR addition of the inputted data and the pattern of the error, and storing the corrected data at the original address of corresponding uncorrected data of said temporary memory;

reading out the data of m symbols from said temporary memory and inputting the read-out data to said CRC generator/checker;

dividing in said CRC generator/checker the inputted data by the same generator polynominal as that used at the time of recording to obtain the error check parities as second residuals resulting from the division;

reading out the error check parities from said sector buffer memory and inputting the read-out error check parities to said CRC generator/checker; and comparing respective corresponding parities with each other and deciding that no error exists when all the comparisons indicate coincidence, but that an error exists when any one or more of the comparisons indicates non-coincidence, thereby effecting error correction of data in each sector and simultaneously effecting detection of a code error of the data in the course of reproducing data from the optical disk.

3. A code error detecting method for detecting a code error of data which is recorded on or reproduced from an optical disk by using a code error detecting apparatus, which code error detecting apparatus comprises:

a sector buffer memory for arranging and storing data in a table of n×m symbols, said data including user's data and control data indicating data recording addresses on an optical disk;

an adder circuit for performing exclusive OR addition of data of n symbols in each vertical column of said table from a first vertical column through an (m−1)-th vertical column and for performing exclusive OR addition of (n−t) symbols in an m-th vertical column;

a CRC generator/checker for dividing information polynominal data constituted by data of m symbols obtained from a result of addition performed on the first vertical column through the m-th vertical column of said table in said adder circuit by a predetermined generator polynominal for error checking;

a temporary memory for storing said polynominal data and error checking parities of t symbols which are residuals obtained as a result of the division performed by said CRC generator/checker; and an error correction circuit for calculating error correction parities for data of m symbols in each horizontal row from a first horizontal row through an n-th horizontal row of said table, said method comprising the steps of: in a recording operation, in parallel with storing data in said sector buffer memory, performing in said adder circuit exclusive OR addition of data of n symbols in each vertical column from the first vertical column through the (m−1)-th vertical column and performing exclusive OR addition of (n−t) symbols in the m-th vertical column;

inputting the data of m symbols of said table to said CRC generator/checker and obtaining error check parities of t symbols as first residuals resulting from a division in said CRC generator/checker of the data of m symbols by a predetermined generator polynominal for error checking;

storing the error check parities in t addresses including the last data of the m-th vertical column of said table of said sector buffer memory;

reading out data of m symbols in each horizontal row from the first horizontal row through the n-th horizontal row of said table of said sector buffer memory, inputting the read-out data of m symbols to said error correction circuit, and dividing the inputted data of m symbols by a predetermined generator polynominal for error correction in said error correction circuit to thereby obtain error correction parities for each horizontal row, storing the error correction parities thus obtained in an (m+1)-th and subsequent columns of said table of said sector buffer memory; and reading out the data sequentially starting from the first vertical column of said sector buffer memory to record the data and said optical disk, and in a reproduction operation, storing data reproduced from said optical disk in said sector buffer memory in the same order as that at the time of recording;

reading out data in the first horizontal row of said table of said sector buffer memory and inputting the read-out data to said error correction circuit;

in parallel with the said inputting of the readout data, inputting to said temporary memory the data in the first horizontal row excluding the error correction parities and the error check parities;

obtaining a location and a pattern of an error in said error correction circuit;

reading out data corresponding to the location of the error from said table of said sector buffer memory and inputting the read-out data to said error correction circuit;

correcting the error by performing exclusive OR addition of the inputted data and the pattern of the error in said error correction circuit;

storing the corrected data at the original address of corresponding uncorrected data from said table of said sector buffer memory;

reading out data corresponding to the location of the error from said temporary memory and inputting the read-out data to said error correction circuit;

correcting the error by performing exclusive OR addition of the inputted data and the pattern of the error in said error correction circuit;

storing the corrected data at the original address of corresponding uncorrected data of said temporary memory;

subsequently, reading out data in a next horizontal row of said sector buffer memory, and, in parallel with the said reading of the data, reading out the corrected data from said temporary memory, and inputting the respective read-out data to said error correction circuit;

performing exclusive OR addition of the data in the respective horizontal rows with respect to each other and storing the resultant data at the original address of corresponding data in said temporary memory;

in parallel with the above-said operation, obtaining a location and a pattern of an error of the data in the next horizontal row which has been inputted previously to said error correction circuit;

reading out data corresponding to the location of the error from said sector buffer memory and inputting the read-out data to said error correction circuit;

correcting the error in said error correction circuit by performing exclusive OR addition of the inputted data and the pattern of the error, and storing the corrected data at the original address of corresponding uncorrected data in said table of said sector buffer memory;

reading out data from said temporary memory and inputting the read-out data to said error correction circuit;

correcting the error in said error correction circuit by performing exclusive OR addition of the inputted data and the pattern of the error, and storing the corrected data at the original address of corresponding uncorrected data in said temporary memory;

upon completion of the processing from the first horizontal row through the n-th horizontal row, inputting the data in said temporary memory to said CRC generator/checker, and dividing the inputted data by the same generator polynominal as that used at the time of recording to obtain error check parities as second residuals resulting from the division;

reading out the error check parities from said sector buffer memory and inputting the read-out error check parities to said CRC generator/checker; and comparing respective corresponding parities with each other and deciding that no error exists when all the comparisons indicate coincidence, but that an error exists when any one or more of the comparisons indicates non-coincidence, thereby effecting error correction of data in each sector and simultaneously effecting detection of a code error of the data in the course of reproducing data from the optical disk.

4. A code error detecting method according to claim 1, wherein, in parallel with performing error correction of data in an i-th horizontal row of said table of said sector buffer memory having a two dimensional data arrangement in vertical columns and horizontal rows, a CRC check of data excluding error correction parities and error check parities is performed in an (i−1)-th horizontal row which has already been subjected to error correction.

5. A code error detecting method according to claims 1, 2 or 3, wherein the error check parities of a binary code of (l×t) bits obtained through the division by a binary generator polynominal of (l×t) order are deemed to be the error check parities of t symbols constituted by a binary code in which one symbol is formed of l bits.

6. A code error detection method according to claims 2 or 3, wherein the data of m symbols, which has been subjected to error correction completely and stored in said temporary memory, is inputted to said CRC generator/checker, and subsequently the error check parities of t symbols, which have been subjected to error correction and have been added at the time of recording and which include the last data in the m-th vertical column of said sector buffer memory, are inputted to said CRC generator/checker, and, when a residual resulting from the division performed by said CRC generator/checker is "0", it is decided that no error exists, otherwise, it is decided that an error exists.

7. A code error detection method according to claims 1, 2 or 3, wherein, when it is decided in said CRC generator/checker that an error exists in a data, the data is not transferred to a host computer, but an error flag is transferred thereto.

* * * * *